(12) United States Patent
Aranzulla et al.

(10) Patent No.: US 11,353,503 B2
(45) Date of Patent: Jun. 7, 2022

(54) METHOD FOR TESTING THE HERMETIC SEAL OF A PACKAGE

(71) Applicant: STMICROELECTRONICS S.R.L., Agrate Brianza (IT)

(72) Inventors: Paolo Aranzulla, Milan (IT); Fabiano Frigoli, Milan (IT); Massimo Greppi, Basiano (IT); Marco Camerani, Rho (IT); Sebastiano Conti, Pregnana Milanese (IT); Guglielmo Roccasalvo, Paullo (IT); Enrico Rosario Alessi, Catania (IT); Massimiliano Pesaturo, Torre de' Roveri (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 447 days.

(21) Appl. No.: 16/451,660

(22) Filed: Jun. 25, 2019

(65) Prior Publication Data

US 2020/0003831 A1 Jan. 2, 2020

(30) Foreign Application Priority Data

Jun. 29, 2018 (IT) .................. 102018000006827

(51) Int. Cl.
*G01R 31/28* (2006.01)
*G01M 3/32* (2006.01)

(52) U.S. Cl.
CPC ....... *G01R 31/2896* (2013.01); *G01M 3/3281* (2013.01); *G01R 31/2862* (2013.01); *G01R 31/2881* (2013.01)

(58) Field of Classification Search
None
See application file for complete search history.

(56) References Cited

U.S. PATENT DOCUMENTS

| 9,593,995 B2 | 3/2017 | Wagner et al. |
| 10,549,982 B2 | 2/2020 | Duqi et al. |
| 2003/0047002 A1* | 3/2003 | Arms .................. G01P 15/0888 73/504.17 |

(Continued)

FOREIGN PATENT DOCUMENTS

| CN | 101278181 A | 10/2008 |
| CN | 103097872 A | 5/2013 |

(Continued)

OTHER PUBLICATIONS

International Standard ISO 22810, First Edition Aug. 1, 2010, Horology—Water-resistant watches, 14 pages.

*Primary Examiner* — Patrick Assouad
*Assistant Examiner* — Haidong Zhang
(74) *Attorney, Agent, or Firm* — Seed Intellectual Property Law Group LLP (57) ABSTRACT

A method for testing the hermetic seal of a packaged device, which includes: a package that delimits a device chamber; and a transducer device, which is arranged within the device chamber and generates an electrical signal indicating at least one physical quantity external to the package. The testing method includes the steps of: imposing a reference pressure in the device chamber; arranging the packaged device in a testing chamber in which a testing pressure is present, different from the reference pressure; and subsequently detecting possible pressure variations within the device chamber.

18 Claims, 7 Drawing Sheets

(56) References Cited

U.S. PATENT DOCUMENTS

| | | | |
|---|---|---|---|
| 2005/0124167 A1* | 6/2005 | Nevin | H01L 21/76264 |
| | | | 438/700 |
| 2007/0084270 A1* | 4/2007 | Jarrett | G01M 3/3281 |
| | | | 73/49.2 |
| 2012/0270354 A1* | 10/2012 | Hooper | G01L 19/141 |
| | | | 438/51 |
| 2014/0034373 A1* | 2/2014 | Yoshikawa | H05K 1/165 |
| | | | 174/260 |
| 2017/0174511 A1* | 6/2017 | Ehmke | B81C 1/00904 |
| 2017/0233245 A1 | 8/2017 | Duqi et al. | |

FOREIGN PATENT DOCUMENTS

| | | |
|---|---|---|
| CN | 106461482 A | 2/2017 |
| CN | 107084806 A | 8/2017 |
| CN | 107976287 A | 5/2018 |
| EP | 3205997 A1 | 8/2017 |
| JP | 2012-042489 A | 3/2012 |
| WO | 2008/038383 A1 | 3/2008 |

* cited by examiner

METHOD FOR TESTING THE HERMETIC SEAL OF A PACKAGE

BACKGROUND

Technical Field

The present disclosure relates to a method for testing the hermetic seal of a package.

Description of the Related Art

As is known, there are today available numerous types of sensors, some of which are water-resistant; i.e., they can detect properly corresponding quantities (for example, pressure and temperature) even when they are under water.

Water-resistant sensors are typically characterized by the presence of corresponding packages, which are appropriately sealed; i.e., they are hermetically closed in order to prevent access of water into the packages themselves.

During the processes for manufacture of water-resistant sensors, and more in general during the processes for manufacture of sensors with hermetically sealed packages, there is felt the desire to be able to detect proper sealing of the packages in order to control the quality of the sensors. In particular, there is known the desire to be able to implement a mechanism for detecting proper sealing of the packages within standard platforms for testing and calibration of electronic devices. Ideally, implementation of this further sensing mechanism enables a high degree of parallelism and a high productivity in order to avoid marked impact on the final costs of the sensors.

Known solutions envisage detection of the hermeticity of sealing of each package by carrying out a procedure that envisages arranging the package so that it will close the opening of a testing chamber, inside which a pre-set pressure is set up, different from the external pressure that acts on the opening. Then, the time plot of the pressure within the testing chamber is detected, this remaining constant in the case where the package is properly sealed; instead, in the case where there is a variation of the pressure inside the testing chamber, it means that the package is not sealed properly.

The procedure described above makes it possible to check that a package is effectively hermetic. In particular, the procedure described makes it possible to check the fluid-tightness of a package by subjecting the latter to air at high pressure. However, the procedure described presents some drawbacks; in particular, it enables testing of just one package at a time; moreover, it is not particularly fast since proper detection of possible variations of the pressure within the testing chamber typically requires a long observation time.

BRIEF SUMMARY

One or more embodiment is directed to a method for testing a hermetic seal of a package. In at least one embodiment, the method overcomes at least one of the drawbacks of the known art.

BRIEF DESCRIPTION OF THE SEVERAL VIEWS OF THE DRAWINGS

For a better understanding of the present disclosure, preferred embodiments thereof are now described purely by way of non-limiting example, with reference to the attached drawings, wherein.

DETAILED DESCRIPTION

Figure 1:
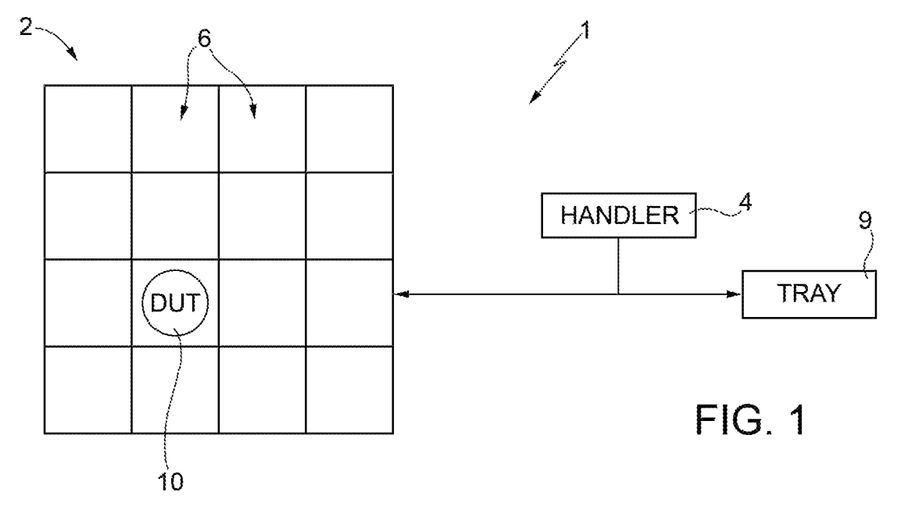
FIG. 1 shows a block diagram of a testing system.

FIG. 1 shows a testing system 1, which comprises a housing structure 2, described hereinafter, and a handling machine 4, such as the so-called pick-and-place handlers or tools.

In detail, the housing structure 2 comprises a plurality of sockets 6, each of which is adapted to house a corresponding packaged device 10 (just one of which is symbolically illustrated in FIG. 1) in order to enable corresponding testing. In this connection, the handling machine 4 is able to pick up individually a plurality of packaged devices 10, for example from a tray 9, and then insert each packaged device 10 into a corresponding socket 6.

This having been said, in what follows the present testing method is described, for simplicity, with reference to the operations carried out on a single packaged device 10, except where otherwise specified.

Figure 2A:
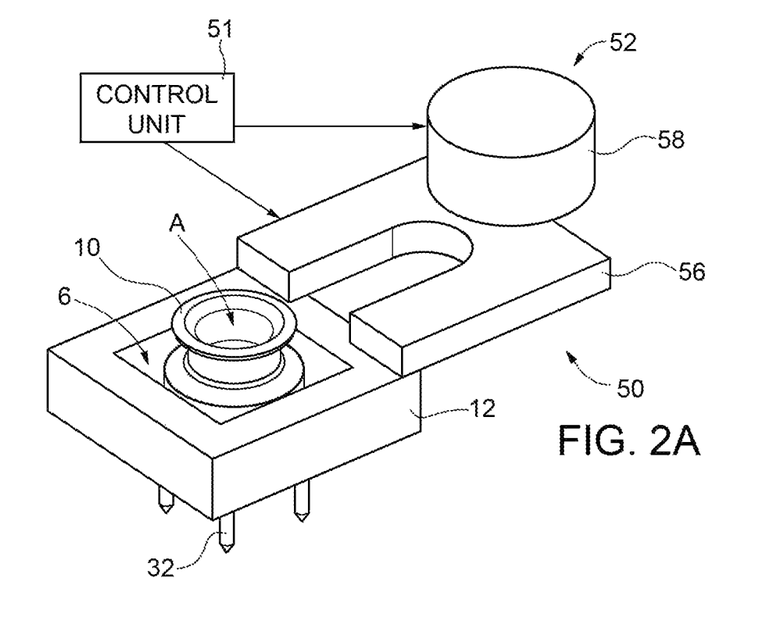
FIG. 2A is a schematic perspective view of parts of the testing system illustrated in FIG. 1.
Figure 2B:
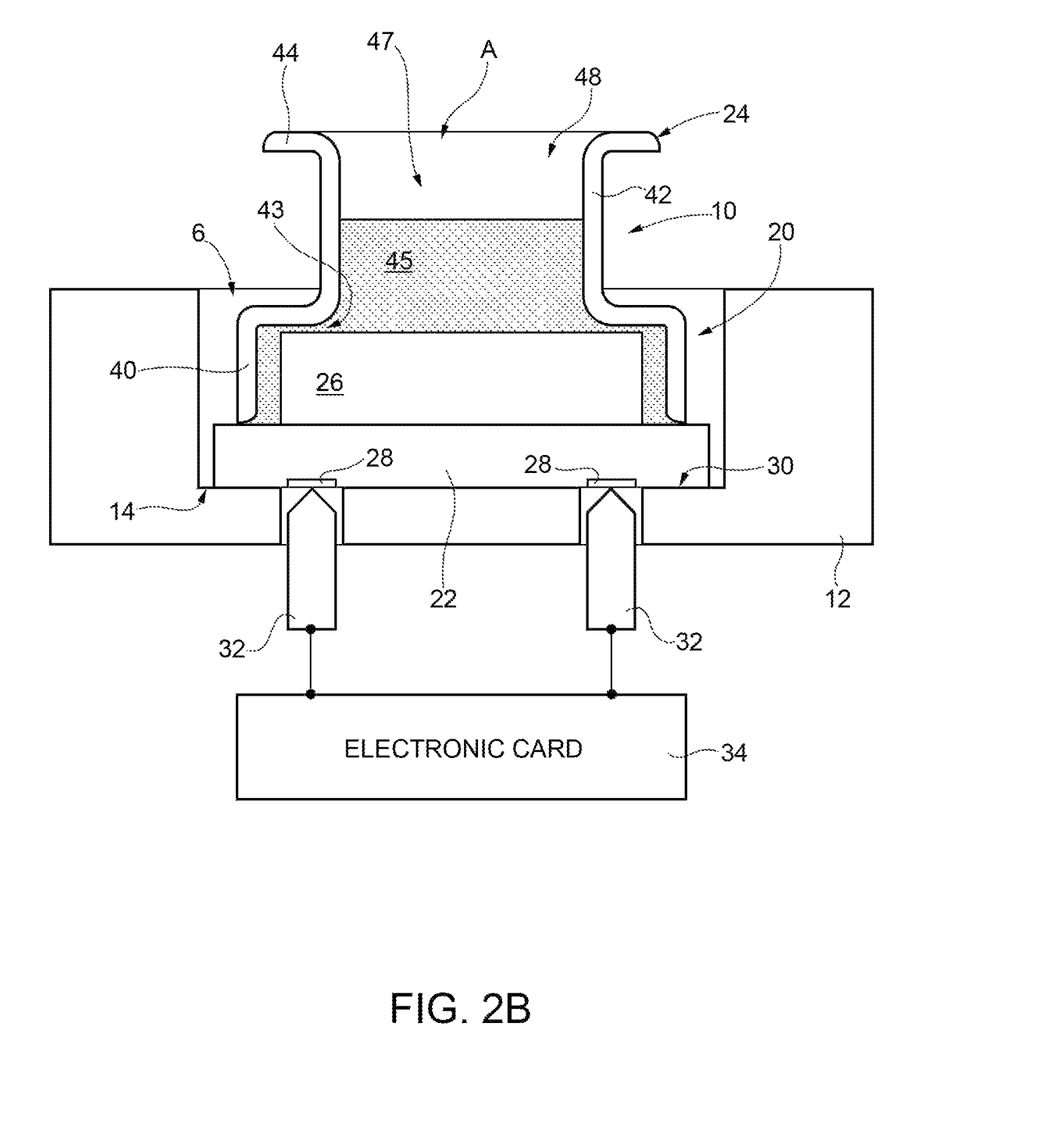
FIG. 2B is a schematic cross-sectional view of portions of the parts of the testing system illustrated in FIG. 1.

As illustrated in FIGS. 2A and 2B, each socket 6 is delimited by a corresponding containment structure 12, which is made, for example, of plastic material and has for instance the shape of a hollow parallelepiped, with a socket (in the case in point, the socket 6), which gives out onto the top base of the parallelepiped.

Without implying any loss of generality, also the socket 6 has the shape of a parallelepiped and is delimited at the bottom by a supporting surface 14, which, in use, supports the packaged device 10.

The packaged device 10 comprises a package 20, which in turn comprises a substrate 22, made, for example, of ceramic material, and a cap 24, made, for example, of metal material. The substrate 22 and the cap 24 are mechanically coupled together in an ideally hermetic way, for example by welding, or else gluing (detail not shown).

The packaged device 10 is arranged in the socket 6 so that the cap 24 overlies the substrate 22, which rests on the supporting surface 14.

Present within the package 20 is a transducer device 26 of a known type, for example of a semiconductor type, such as a semiconductor die or chip comprising an active surface. The transducer device 26 is electrically coupled to pads 28 of conductive material, which are arranged within the substrate 22, and in particular are arranged so as to extend at a bottom surface 30 of the substrate 22, which, during testing, contacts the supporting surface 14.

The testing system 1 further comprises, for each socket 6, a plurality of electrical pointed connectors 32, also known as "pogo pins", which traverse the bottom base of the containment structure 12 so that the respective pointed ends give out onto the supporting surface 14, forming corresponding fixed electrical contacts, each of which is adapted to contact a corresponding pad 28 of the corresponding packaged device 10. Each pogo pin 32 is moreover connected to an electronic card 34 (connection illustrated schematically in FIG. 2B) of the testing system 1, which is hence electrically coupled to each packaged device 10, when the latter is housed in the corresponding socket 6.

Without implying any loss of generality, the cap 24 of the packaged device 10 is, to a first approximation, bobbin-shaped. The cap 24 then comprises a bottom hollow portion 40, which has a cylindrical shape, which is mechanically coupled to the substrate 22, and houses the transducer device 26, which is also supported by the substrate 22. In particular, the bottom hollow portion 40 laterally delimits a recess 43, arranged inside which is the transducer device 26.

Moreover, the cap 24 comprises a top hollow portion 42, which has a cylindrical shape and is connected to the underlying bottom hollow portion 40; for example, the bottom hollow portion 40 and the top hollow portion 42 may be coaxial, and the top hollow portion 42 may have a diameter smaller than the diameter of the bottom hollow portion 40. In addition, the cap 24 comprises a hollow edge portion 44 (optional), which may, for example, form a flange. Furthermore, the hollow edge portion 44 laterally delimits an opening A of the packaged device 10.

In greater detail, the top hollow portion 42 laterally delimits a corresponding socket 47, which is interposed between the overlying opening A and the underlying recess 43.

The package 20 further comprises a filling material or a filling region 45, which is made, for example, of an elastic material (for example, a silicone gel) and extends in the cap 24 so as to fill the part of the recess 43 not occupied by the transducer device 26, as well as part of the socket 47 laterally delimited by the top hollow portion 42. Consequently, the filling region 45 contacts the transducer device 26; moreover, the filling region 45 is delimited at the top by a closing surface 48, which faces the hollow edge portion 44 and is fluidically coupled to the opening A of the packaged device 10. Consequently, in use, the external pressure acts on the closing surface 48.

In greater detail, the filling region 45 hermetically closes the socket 47 laterally delimited by the top hollow portion 42; i.e., it couples mechanically to the top hollow portion 42 of the cap 24 so that this coupling is fluid-tight. Consequently, even though the packaged device 10 is immersed in water, the transducer device 26 remains protected from the water. Instead, in the case where the filling region 45 were absent, the recess 43, the socket 47 laterally delimited by the top hollow portion 42, and the opening A would be in fluid communication.

In addition, the filling region 45 is such that the transducer device 26 is subject to the same pressure as the one present on the closing surface 48. In other words, the filling region 45 transmits to the transducer device 26 the pressure present on the closing surface 48.

As illustrated in FIG. 2B, and without implying any loss of generality, when the packaged device 10 is arranged in the corresponding socket 6 of the housing structure 2, the bottom hollow portion 40 of the cap 24 extends in the socket 6, whereas the top hollow portion 42 and the edge portion 44 of the cap 24 protrude out of the containment structure 12, and hence out of the socket 6.

With regards to the transducer device 26, it is of a type in itself known and is able to generate an electrical output signal, indicating the pressure to which it is subject. This electrical output signal is sent to the pads 28, and then to the electronic card 34, which is able to determine an estimate of the pressure to which the packaged device 10 is subject on the basis of the electrical output signal generated by the latter.

Even though it is not shown, the transducer device 26 may comprise a first die of semiconductor material, formed inside which is a micro-electro-mechanical (MEMS) device, which includes a deformable portion (for example, a semiconductive membrane), configured to undergo deformation as a function of the pressure to which the transducer device 26 is subjected, and a detection system, configured to generate a preliminary electrical signal, as a function of the deformation of the aforementioned deformable portion. Moreover, the transducer device 26 may comprise a second die of semiconductor material, which is electrically coupled to the first die and to the pads 28. Formed within the second die is a dedicated integrated circuit, which generates the electrical output signal, as a function of the preliminary electrical signal.

In practice, each packaged device 10 forms a pressure sensor. In a way in itself known, each packaged device 10 may in any case implement further functions (e.g., detection of temperature), for example performed by integrated circuits formed in further dice, which are also arranged inside the recess 43.

Once again with reference to the testing system 1, this further comprises a fixing structure 50 and an actuation structure 52 (FIG. 2A). Except where otherwise specified, the fixing structure 50 and the actuation structure 52 are now described limitedly to the corresponding portions that, during testing, operatively couple, as described hereinafter, to a single packaged device 10, even though these structures are modular and hence each comprise a plurality of portions that are the same as one another, each portion being operatively coupleable to a corresponding packaged device 10.

In detail, the fixing structure 50 comprises a fixing element 56, which has, for example, a shape such as to be able to couple mechanically, in a releasable way, to the package 20. For instance, the fixing element 56 is C-shaped and defines a concavity. Moreover, the fixing structure 50 may be controlled alternatively in a first operating condition or a second operating condition. For instance, the fixing structure 50 is controlled by a control unit 51, illustrated only in FIG. 2A.

Figure 3:
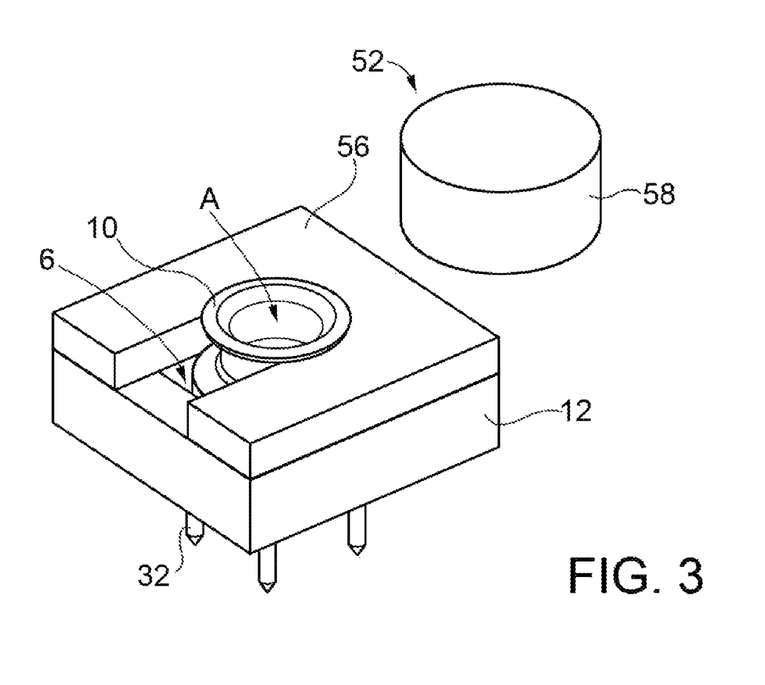
FIG. 3 is a schematic perspective view of the parts of the testing system illustrated in FIG. 2A, in a different operating condition.

In the first operating condition (illustrated schematically in FIG. 2A), the fixing element 56 is arranged at a distance from the corresponding socket 6, and hence also from the corresponding packaged device 10. In the second operating condition (illustrated in FIG. 3), the fixing element 56 couples mechanically to the package 20 of the packaged device 10, so that the top hollow portion 42 of the cap 24 extends in the concavity defined by the fixing element 56. Moreover, the fixing element 56 fixes the package 20 to the supporting surface 14 of the socket 6 in order to provide electrical contact between the pads 28 and the pogo pins 32. In practice, in the second operating condition, the fixing element 56 provides that the packaged device 10 maintains a correct position within the socket 6; moreover, the fixing element 56 leaves the opening A open.

The actuation structure 52 comprises an actuator 58 that is controlled by the control unit 51 and can also operate in a respective first operating condition or second operating condition, it being possible to implement this second operating condition only when also the fixing structure 56 operates in the respective second operating condition.

In the first operating condition (visible in FIGS. 2A and 3), the actuator 58 is arranged at a distance from the corresponding socket 6, and hence also from the corresponding packaged device 10. In the second operating condition (illustrated in FIGS. 4A and 4B), the actuator 58 couples mechanically to the package 20 of the packaged device 10, which, as has been said, is temporarily fixed inside the socket 6.

Figure 4A:
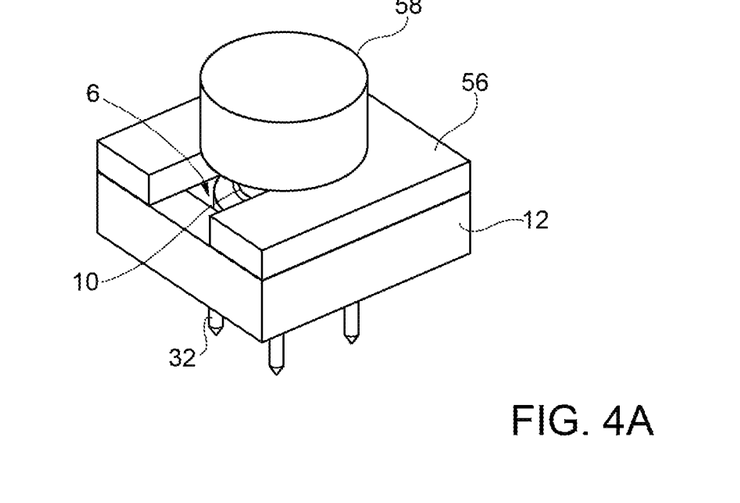
FIG. 4A is a schematic perspective view of the parts of the testing system illustrated in FIGS. 2A and 3, in a different operating condition.
Figure 4B:
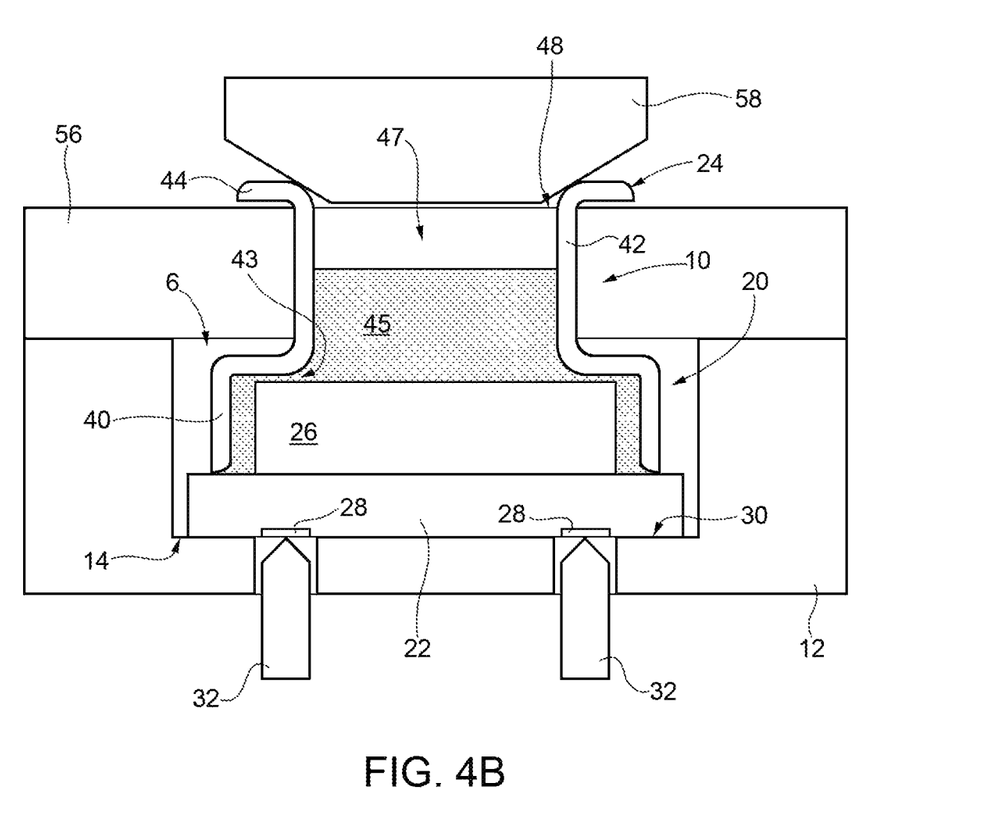
FIG. 4B is a schematic cross-sectional view of the parts of the testing system illustrated in FIG. 4A.

In greater detail, when the actuation structure 52 operates in the respective second operating condition, the actuator 58 is arranged so as to extend through the opening A of the cap 2, closing it hermetically, at a distance from the closing surface 48.

The testing system 1 further comprises a testing chamber 60 (illustrated in FIG. 6), arranged inside which are the housing structure 2, the fixing structure 50, the actuation structure 52, and the electronic card 34.

Figure 5:
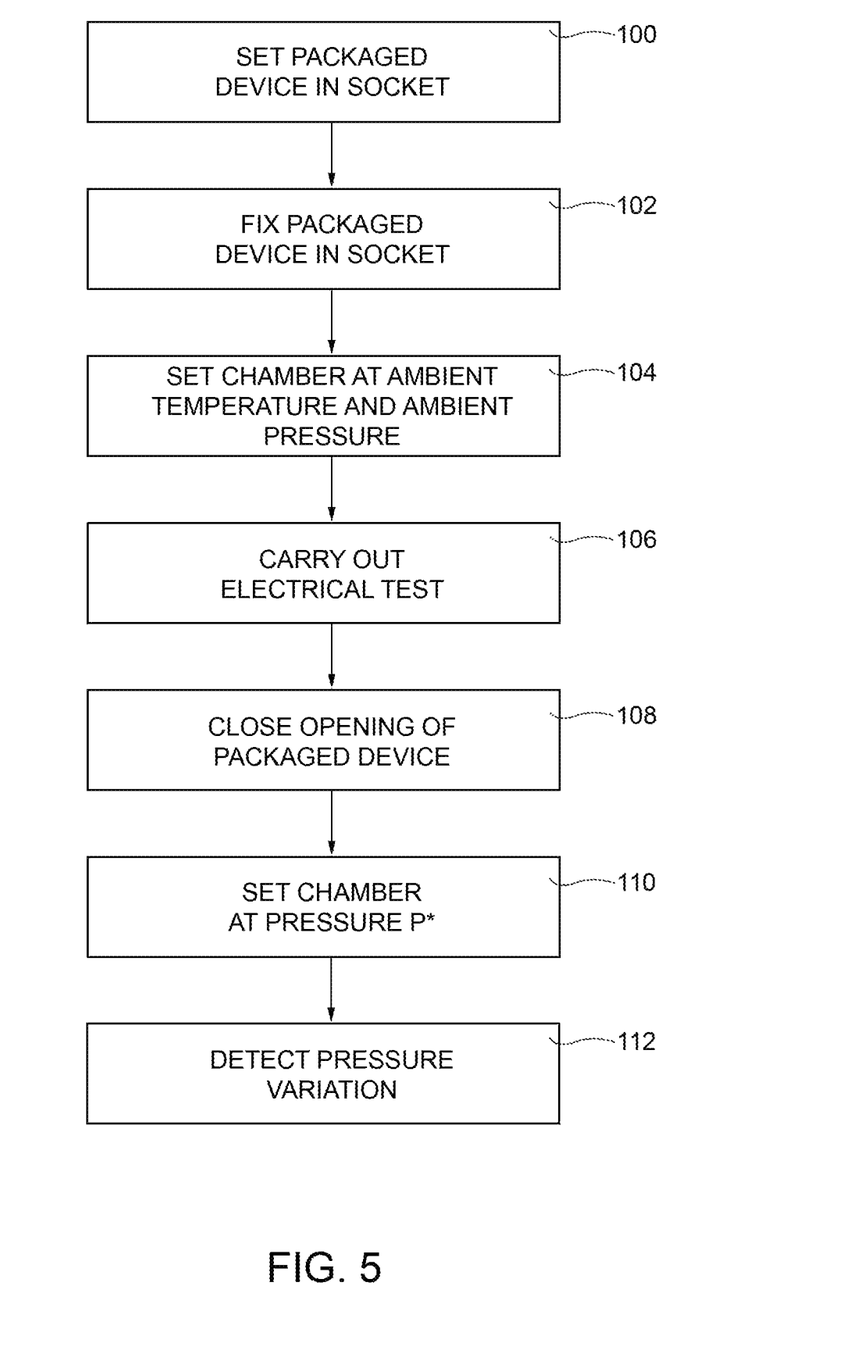
FIG. 5 shows a flowchart of operations performed according to the present testing method.

All this having been said, at least one embodiment is directed to a testing method, the steps of which are described in what follows and illustrated in FIG. 5, which also concern a single packaged device 10, except where otherwise specified. It is moreover pointed out that, even though it is not shown, the control unit 51 is electrically connected to the electronic card 34.

Initially, the handling machine 4 places (block 100) the packaged device inside the corresponding socket 6 of the housing structure 2. In addition, the fixing structure 50 is driven by the control unit 51 into the respective second operating condition so that the packaged device 10 is fixed (block 102) in the socket 6. In the meantime, the actuation structure 52 operates in the respective first operating condition so that what has been described above occurs, as illustrated in FIG. 3.

The testing chamber 60 is set (block 104) at ambient pressure and ambient temperature (for example, the testing chamber 60 may be left open), so that the closing surface 48 of the filling region 45, and hence also the transducer device 26, is at ambient pressure. In these conditions, an electrical test is carried out (block 106) in a way in itself known; i.e., the control unit 51 checks that the estimate of pressure calculated by the electronic card 34 on the basis of the electrical output signal supplied by the packaged device 10 has a pre-set level of accuracy.

The actuation structure 52 is driven by the control unit 51 into the second operating condition so that the actuator 58 hermetically closes (block 108) the opening A of the packaged device 10. To a first approximation, this operation does not entail any variation of the pressure inside the package 20. Within the package 20, and hence on the closing surface 48 and on the transducer device 26, the pressure remains equal to atmospheric pressure. There thus arises the situation illustrated in FIGS. 4A and 4B.

The testing chamber 60 is closed, and the pressure within the testing chamber 60 is brought to a value P* (block 110), different from ambient pressure. Without implying any loss of generality, in the embodiment that follows, it is assumed that P* is higher than ambient pressure (for example, it is 3 bar). The situation illustrated in FIG. 6 hence occurs.

In practice, the recess 43 and the socket 47 form a sort of secondary chamber (designated by 49 in FIG. 6), coupled to the transducer device 26 and filled by the filling region 45. The secondary chamber 49 is at ambient pressure, which represents a sort of reference pressure. Moreover, the secondary chamber 49 is located inside the testing chamber 60, which functions as a main chamber and is at the aforementioned pressure P.

Figure 6:
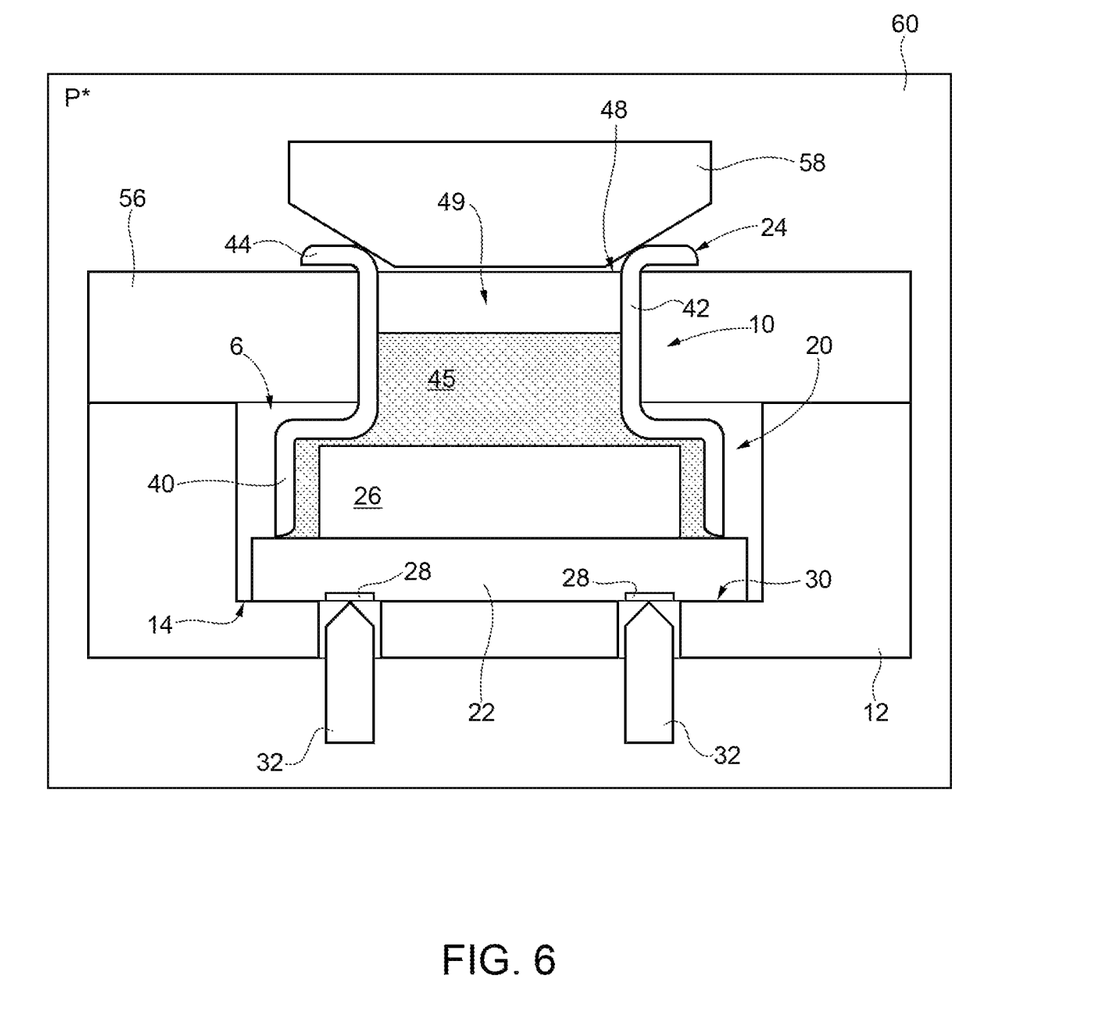
FIG. 6 is a schematic cross-sectional view of a chamber and of parts of the present testing system housed therein.

In the case where the mechanical coupling between the cap 24 and the substrate 22 is correct, and hence hermetic, the secondary chamber 49 is fluidically decoupled from the testing chamber 60, and hence the pressure inside the secondary chamber 49 does not change. Conversely, in the case where the mechanical coupling between the cap 24 and the substrate 22 is defective, there occurs a flow of air from the testing chamber 60 to the secondary chamber 49, through slits present in the junction between the substrate 22 and the cap 24, on account of the difference in pressure present.

This having been said, after the operations represented in block 110 have been carried out, the control unit 51 monitors, through the electronic card 34, the pressure within the secondary chamber 49, as detected by the transducer device 26. In particular, the control unit 51 detects (block 112) whether there is a drift in time of the pressure detected by the transducer device 26. In the case where the control unit 51 detects that the pressure detected by the transducer device 26 remains constant for a pre-set time interval, the package 20 is properly sealed; instead, if the control unit 51 detects, in the aforementioned time interval, a variation of pressure, this means that the package 20 presents leakages, and hence the control unit 51 notifies this situation so that adequate action can be taken (for example, the packaged device 10 may be rejected).

In greater detail, within the secondary chamber 49 it is possible to apply, to a first approximation, the perfect-gas law:

$$PV=nRT$$

where P is the pressure, V is the volume of the secondary chamber 49, n is the number of moles, R is the perfect-gas constant, and T is the temperature. Moreover, to a first approximation, the volume and temperature remain constant; consequently, differentiating in time (denoted by t), we obtain:

$$dP/dt=(RT/V) \cdot dn/dt$$

Since the secondary chamber 49 has very limited dimensions, for example if compared with the dimensions of the testing chamber 60, it may be noted how even a minor loss of air may cause an appreciable variation of pressure, which is detected by the transducer device 26. In other words, the small volume of the secondary chamber 49 makes it possible to detect possible pressure variations in short times. Furthermore, since the methodology proposed envisages the use, as secondary chamber, of the chamber formed within the packaged device 10, this methodology is compatible with a high degree of parallelism, since it is possible to provide just one main chamber (in the case in point, the testing chamber 60), arranged inside which are numerous secondary sockets, formed by corresponding packaged devices to be tested. Again, the present methodology envisages the use of pressure sensors integrated within the devices to be tested themselves, with consequent simplification of the testing system.

The present testing method may in any case be applied also in the case where the packaged device 10 does not contain a pressure transducer inside, as illustrated purely by way of example in FIG. 7, which is now described with reference to just the differences as compared to FIG. 6.

Figure 7:
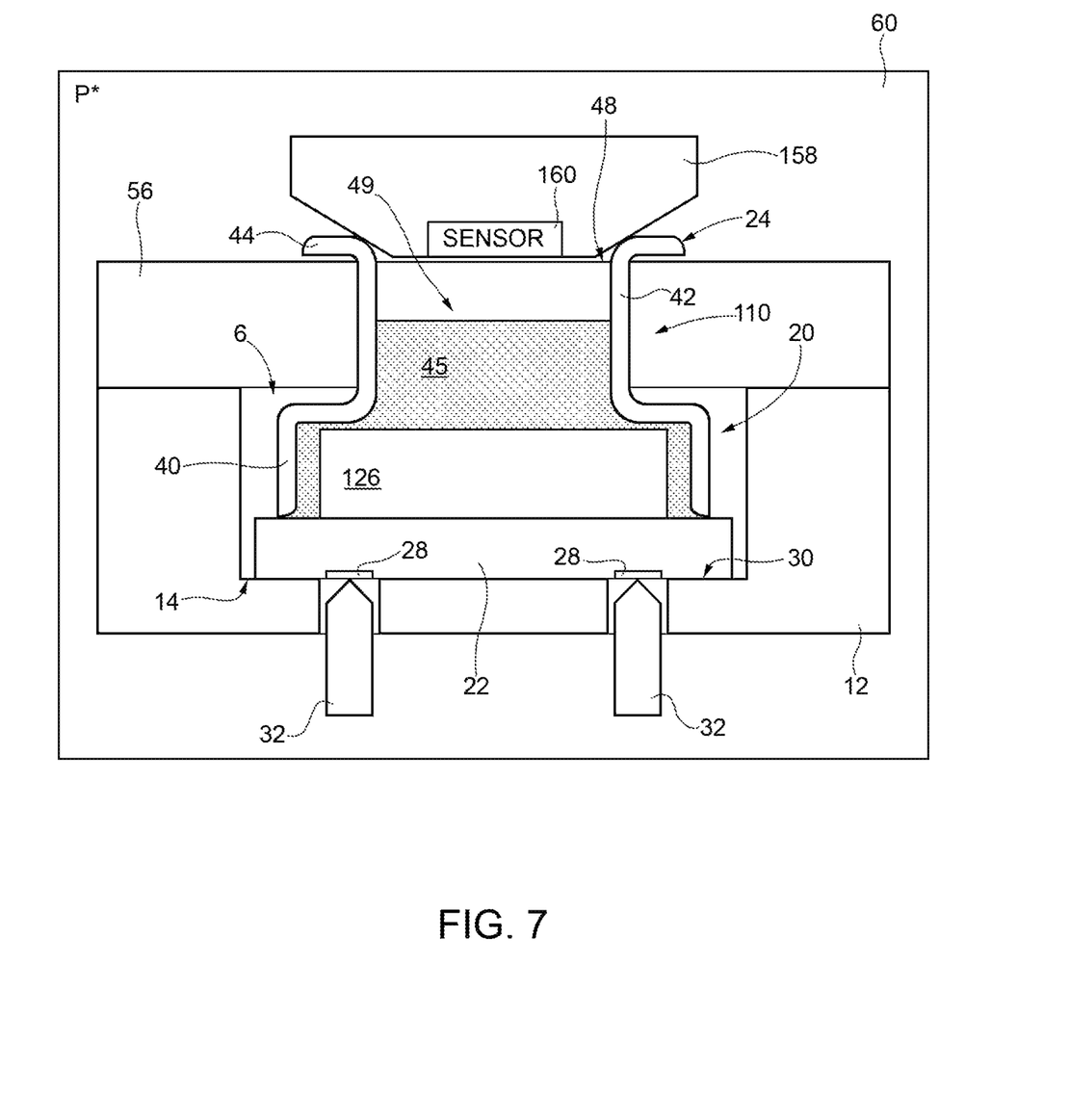
FIG. 7 is a schematic cross-sectional view of a chamber and of parts of the present testing system housed therein, according to a variant of the present testing method.

In detail, the transducer device (designated by 126) of the packaged device (designated by 110) illustrated in FIG. 7 is unable to detect the pressure to which it is subject. For instance, the transducer device 126 generates an electrical output signal indicating the temperature to which it is subjected.

In this case, the actuator (designated by 158) is equipped with a corresponding pressure sensor 160, of a type in itself known, electrically connected to the control unit 51.

In particular, when the actuation structure 52 operates in the second operating condition, the pressure sensor 160 is operatively coupled to the secondary chamber 49; i.e., it is able to detect the pressure within the secondary chamber 49. In addition, as already explained previously, the actuator 58 hermetically closes the opening A of the packaged device 110; consequently, possible variations, with respect to ambient pressure, of the pressure present within the secondary chamber 49 are to be put down to losses that afflict the join between the cap 24 and the substrate 22.

In general, the pressure sensor 160 may also be used in the case where the transducer device is provided with the capacity of detecting the pressure.

Finally, it is clear that modifications and variations may be made to the testing method described and illustrated herein, without thereby departing from the sphere of protection of the present disclosure.

For instance, the shape of the package may vary with respect to what has been described. Consequently, also the details regarding the mechanical coupling between the package and the fixing element and the actuator may vary, as likewise the shape of the fixing element and of the actuator.

The details of implementation and the functions of the transducer device, and more in general of the packaged device, may vary with respect to what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    testing a hermetic seal of a first packaged device, wherein the first package device comprises:
        a package that delimits a device chamber, wherein the package comprises a cap that delimits the device chamber and forms an opening fluidically coupled to the device chamber; and
        a semiconductor transducer device arranged within the device chamber and configured to generate an electrical signal indicative of a physical quantity external to the package;
    the testing comprising:
        arranging the first packaged device in a testing chamber;
        exposing the testing chamber to a reference pressure;
        carrying out an electrical test of the semiconductor transducer device;
        after exposing the reference pressure to the device chamber, hermetically closing the opening and sealing the device chamber;
        exposing the testing chamber to a testing pressure, wherein the testing pressure is different from the reference pressure; and
        at the testing pressure, testing for possible pressure variations within the device chamber.

2. The method according to claim 1, wherein the package comprises a filling material that delimits a surface of the device chamber, wherein the filling material covers the semiconductor transducer device and has a surface exposed at an opening of the package, and wherein the filling material is configured to transmit onto the semiconductor transducer device a pressure present in the opening.

3. The method according to claim 2, wherein the package further comprises a substrate mechanically coupled to the cap, wherein the substrate supports the semiconductor transducer device, and wherein the filling material and the cap form a fluid-tight mechanical coupling.

4. The method according to claim 1, wherein the semiconductor transducer device comprises a pressure transducer, and wherein testing for possible pressure variations within the device chamber involves using the pressure transducer.

5. The method according to claim 1, wherein hermetically closing the opening comprises closing the opening with a closing element that is mechanically coupled to a pressure sensor, and wherein testing for possible pressure variations within the device chamber is carried out through the pressure sensor.

6. The method according to claim 1, wherein the semiconductor transducer device is a semiconductor microelectromechanical system.

7. The method according to claim 1, wherein the testing pressure is higher than the reference pressure.

8. The method according to claim 1, wherein the reference pressure is ambient.

9. A method, comprising:
    testing hermetic seals of a plurality of packaged devices, wherein each of the plurality of package devices includes a first packaged device, wherein each first package device comprise:
        a package body that delimits a device chamber; and
        a transducer device arranged within the device chamber and configured to generate an electrical signal indicative of a physical quantity external to the package body,
    wherein the testing comprises:
        imposing a reference pressure in the device chamber of the first packaged device;
        after imposing the reference pressure in the device chamber of the first packaged device, hermetically closing an opening of the first packaged device with a closing element that is mechanically coupled to a pressure sensor and sealing the device chamber;
        arranging the first packaged device in a testing chamber, the testing pressure in the testing chamber being different from the reference pressure; and
        testing for possible pressure variations within the device chamber of the first packaged device, wherein testing for possible pressure variations within the device chamber of the first packaged device includes using the pressure sensor.

10. The method according to claim 9, wherein the transducer device of the first packaged device comprises a pressure transducer, and wherein testing for possible pressure variations within the device chamber testing pressure variations using the pressure transducer of the first packaged device.

11. The method according to claim 9, wherein the package body includes a filling material that covers the transducer device in the device chamber.

12. The method according to claim 9, wherein testing pressure is higher than the reference pressure.

13. The method according to claim 12, wherein the reference pressure is ambient pressure and the testing pressure is greater than ambient pressure.

14. A method, comprising:
testing a hermetic seal of a packaged device, wherein the package device comprises a package, a semiconductor transducer device, and a chamber, wherein the package includes a cap and a substrate mechanically coupled to the cap, wherein the semiconductor transducer device is coupled to the substrate and a filling material covers the semiconductor transducer device, wherein the filling material and the cap form a fluid-tight mechanical coupling when the cap is sealed, wherein the semiconductor transducer device is located in the chamber and sealed by the package, and wherein the semiconductor transducer device is configured to detect pressure, wherein the testing comprising:
arranging the packaged device in a testing chamber;
exposing the testing chamber to a reference pressure;
carrying out an electrical test of the semiconductor transducer device;
closing an opening of the packaged device to seal the chamber;
exposing the testing chamber to a testing pressure, wherein the testing pressure is different from the reference pressure; and
while the testing chamber is at the testing pressure, testing for possible pressure variations within the chamber.

15. The method according to claim 14, wherein the reference pressure is ambient pressure and the testing pressure is greater than ambient pressure.

16. The method according to claim 14, wherein testing for possible pressure variations within the chamber comprises testing the pressure for a period of time.

17. The method according to claim 14, wherein testing the pressure over the period of time comprises testing for drift in the pressure over the period of time.

18. The method according to claim 14, wherein an actuator that includes a pressure sensor closes the opening of the package device and is used for testing for possible pressure variations in the chamber.

* * * * *